(12) United States Patent
Terrovitis

(10) Patent No.: US 8,988,121 B2
(45) Date of Patent: *Mar. 24, 2015

(54) METHOD AND APPARATUS FOR GENERATING A REFERENCE SIGNAL FOR A FRACTIONAL-N FREQUENCY SYNTHESIZER

(71) Applicant: QUALCOMM Incorporated, San Diego, CA (US)

(72) Inventor: Emmanouil Terrovitis, Foster City, CA (US)

(73) Assignee: QUALCOMM Incoporated, San Diego, CA (US)

( * ) Notice: Subject to any disclaimer, the term of this patent is extended or adjusted under 35 U.S.C. 154(b) by 67 days.

This patent is subject to a terminal disclaimer.

(21) Appl. No.: 13/898,215

(22) Filed: May 20, 2013

(65) Prior Publication Data

US 2014/0340132 A1    Nov. 20, 2014

(51) Int. Cl.
*H03L 7/06*    (2006.01)
*H03L 7/08*    (2006.01)

(52) U.S. Cl.
CPC .................................... *H03L 7/08* (2013.01)
USPC ........................................ 327/156; 327/158

(58) Field of Classification Search
CPC ....... H03L 7/093; H03L 1/02; H03L 2207/12; H03L 7/113; H03L 7/1086; H03L 7/087; H03L 7/185; H03B 21/01; H03B 2200/0034; H03B 5/04; H03B 5/1293

USPC ............... 327/156–158, 105; 331/25, 17; 375/376, 216, 322, 324, 346, 349; 455/226.1, 258, 324

See application file for complete search history.

(56) References Cited

U.S. PATENT DOCUMENTS

| | | | |
|---|---|---|---|
| 4,701,793 A * | 10/1987 | den Hollander et al. ..... 348/447 |
| 6,426,660 B1 * | 7/2002 | Ho et al. ...................... 327/175 |
| 6,960,947 B2 | 11/2005 | Albasini et al. |
| 7,295,824 B2 | 11/2007 | Kluge et al. |
| 7,369,001 B2 | 5/2008 | Yu |
| 7,463,710 B2 | 12/2008 | Walsh et al. |
| 8,786,329 B1 * | 7/2014 | Terrovitis ..................... 327/122 |
| 2003/0117188 A1 | 6/2003 | Nakanishi |
| 2010/0073052 A1 | 3/2010 | Choi et al. |

FOREIGN PATENT DOCUMENTS

EP     0800276  A1     10/1997

OTHER PUBLICATIONS

Co-pending U.S. Appl. No. 13/651,280, filed Oct. 12, 2012.

(Continued)

*Primary Examiner* — Diana J Cheng
(74) *Attorney, Agent, or Firm* — Mahamedi Paradice LLP

(57) ABSTRACT

A frequency synthesizing system includes a clock generator to generate a reference clock signal, a frequency doubler to generate a frequency-doubled clock signal in response to rising edges and falling edges of the reference clock signal, a frequency multiplier to generate a frequency-multiplied clock signal in response to either rising edges or falling edges of the frequency-doubled clock signal, and a fractional-N synthesizer coupled to the frequency multiplier to generate an output clock signal in response to the frequency-multiplied clock signal.

16 Claims, 13 Drawing Sheets

(56) References Cited

OTHER PUBLICATIONS

Gierkink, et al, "Low-spur, low-phase-noise clock multiplier based on a combination of PLL and recirculating DLL with dual-pulse ring oscillator and self-correcting charge pump", IEEE Journal of Solid-State Circuits, vol. 43, No. 12, Dec. 2008, pp. 2967-2976.

Park, et al., "A 14.2mW 2.55-to-3GHz Cascaded PLL with Reference Injection, 800MHz Delta-Sigma Modulator and 255fsrms Integrated Jitter in 0.13µm CMOS," 2012 IEEE International Solid-State Circuits Conference, ISSCC 2012 / Session 20 / RF Frequency Generation / 20.2, pp. 344-346.
International Search Report and Written Opinion—PCT/US2014/038285—ISA/EPO—Sep. 8, 2014.

* cited by examiner

METHOD AND APPARATUS FOR GENERATING A REFERENCE SIGNAL FOR A FRACTIONAL-N FREQUENCY SYNTHESIZER

TECHNICAL FIELD

The present embodiments relate generally to frequency synthesizers, and specifically to systems and methods generating a frequency-multiplied clock signal suitable for use by a fractional-N frequency synthesizer.

BACKGROUND OF RELATED ART

Frequency synthesizers may be used to generate high frequency clock signals in response to a lower frequency reference clock signal. For example, FIG. 1 shows a block diagram of a phase-locked loop (PLL) configured as a fractional-N frequency synthesizer 100. Synthesizer 100 includes a phase and frequency detector (PFD) 102, a charge pump 104, a loop filter 106, a voltage-controlled oscillator (VCO) 108, a frequency divider 110, and a sigma-delta modulator (SDM) 112. The PFD 102 compares the relative timing (e.g., phase difference) between the edges of a reference signal (X) and a feedback (FB) signal to generate UP and DN control signals. Charge pump 104 converts the UP and DN control signals to a charge ($Q_C$) that is proportional to the phase difference of signals X and FB. The charge generated by the charge pump 104 is filtered (e.g., integrated) by filter 106 and provided as a control voltage $V_C$ to the VCO 108. The VCO 108 generates an output signal OUT (e.g., in response to the control voltage $V_C$). The output signal OUT is divided by frequency divider 110, which is modulated by a control signal 111 provided by the SDM 112. Because the control signal 111 provided by the SDM 112 may be different for each reference cycle, the output signal OUT may have a frequency that is a non-integer multiple of the frequency of the reference signal X.

Noise associated with the SDM 112 may cause degradation of the synthesizer's phase noise, especially when the synthesizer 100 is to lock the output signal OUT at frequencies substantially higher than (e.g., several or more multiples of) the frequency of the reference signal X. It is desirable to reduce the impact of such noise upon performance of the synthesizer 100.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A frequency synthesizer system and method of operation are disclosed that may reduce phase noise associated with generating higher-frequency signals from lower-frequency signals. For some embodiments, the system includes a frequency doubler, and frequency multiplier, and a fractional-N frequency synthesizer. The frequency doubler includes an input to receive a reference clock signal, and includes an output to provide a frequency-doubled clock signal. The frequency multiplier includes an input to receive the frequency-doubled clock signal, and includes an output to provide a frequency-multiplied clock signal. The frequency-multiplied clock signal has a frequency that is N times greater than the frequency of the frequency-doubled signal, where N is an integer greater than or equal to 2. The fractional-N frequency synthesizer includes an input to receive the frequency-multiplied clock signal, and includes an output to provide a high-frequency output clock signal. The output clock signal generated by the fractional-N frequency synthesizer may have a frequency that is several times (or more) greater than the frequency of the frequency-multiplied clock signal.

For some embodiments, the frequency doubler may double the frequency of the reference clock signal to generate the frequency-doubled clock signal by generating a clock positive (or negative) edge from each rising edge and each falling edge of the reference clock signal. In this manner, the frequency doubler may operate as a double-edge based frequency doubling circuit that causes a rising (falling) edge transition in the frequency-doubled clock signal in response to every state transition of the reference clock signal. The rising (falling) edges of the doubled clock are triggered by the transitions of the original clock and have a very small timing error, while the falling (rising) edges may be generated by a noisy delay and may have a large timing error. The falling (rising) edges are generally inappropriate for use as a reference signal for the frequency multiplier.

For some embodiments, the frequency multiplier may multiply the frequency of the frequency-doubled clock signal to generate the frequency-multiplied clock signal. The frequency multiplier may generate any number (e.g., K) of clock positive (or negative) edges from each rising (falling) edge of the frequency-doubled clock signal, which originate from the state transitions of the original clock signal at the frequency doubler's input. In this manner, the frequency multiplier may operate as a single-edge based frequency multiplying circuit that causes one or more state transitions in the frequency-multiplied clock signal in response to every other state transition of the frequency-doubled clock signal, thereby increasing the frequency of the frequency-doubled clock signal by an integer multiple K to generate the frequency-multiplied clock signal.

For some embodiments, a cascade configuration of the frequency doubler and the frequency multiplier may provide a low-noise, high-frequency clock signal that is suitable for use as a reference or input clock signal by the fractional-N frequency synthesizer. By increasing the frequency of the clock signal provided to the fractional-N frequency synthesizer (e.g., using the frequency doubler and the frequency multiplier), the phase noise contribution of certain noise sources to the synthesizer output is minimized which allows more flexibility in the optimization of the synthesizer loop bandwidth and results in lower synthesizer output phase noise and faster settling. Specifically, with higher reference frequency, the quantization noise of the Sigma Delta modulator may be distributed over wider bandwidth and its contribution to synthesizer phase noise is minimized.

BRIEF DESCRIPTION OF THE DRAWINGS

The present embodiments are illustrated by way of example and are not intended to be limited by the figures of the accompanying drawings, where.

Like reference numerals refer to corresponding parts throughout the drawing figures.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components.

Figure 9:
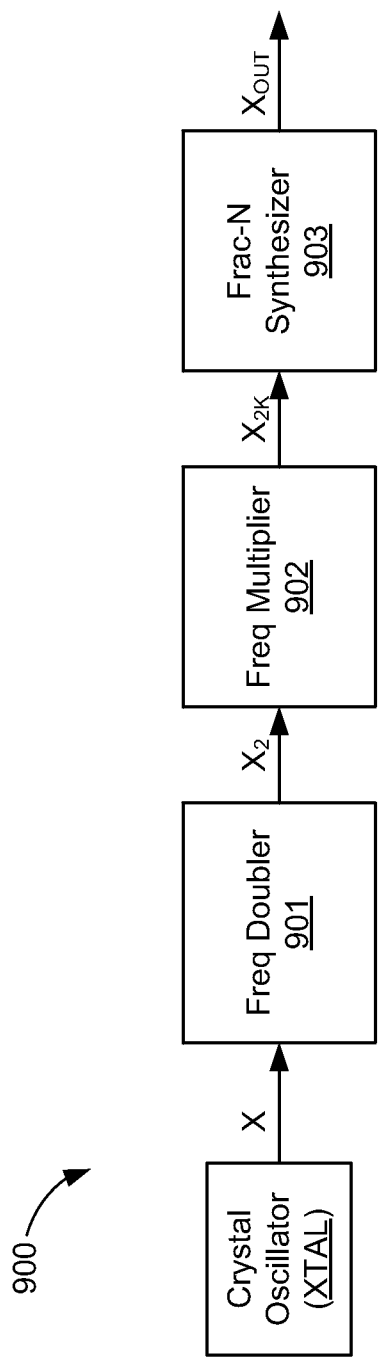
FIG. 9 shows a block diagram of a cascaded frequency synthesizer system in accordance with some embodiments.

FIG. 9 shows a cascaded frequency synthesizer (CFS) system 900 in accordance with the present embodiments. The system 900 is shown to include a crystal oscillator (XTAL), a frequency doubler 901, a frequency multiplier 902, and a fractional-N frequency synthesizer 903 coupled together in a cascade configuration. The XTAL is to generate a reference clock signal X. For other embodiments, other suitable clock generators may be used to generate the reference clock signal X.

Figure 1:
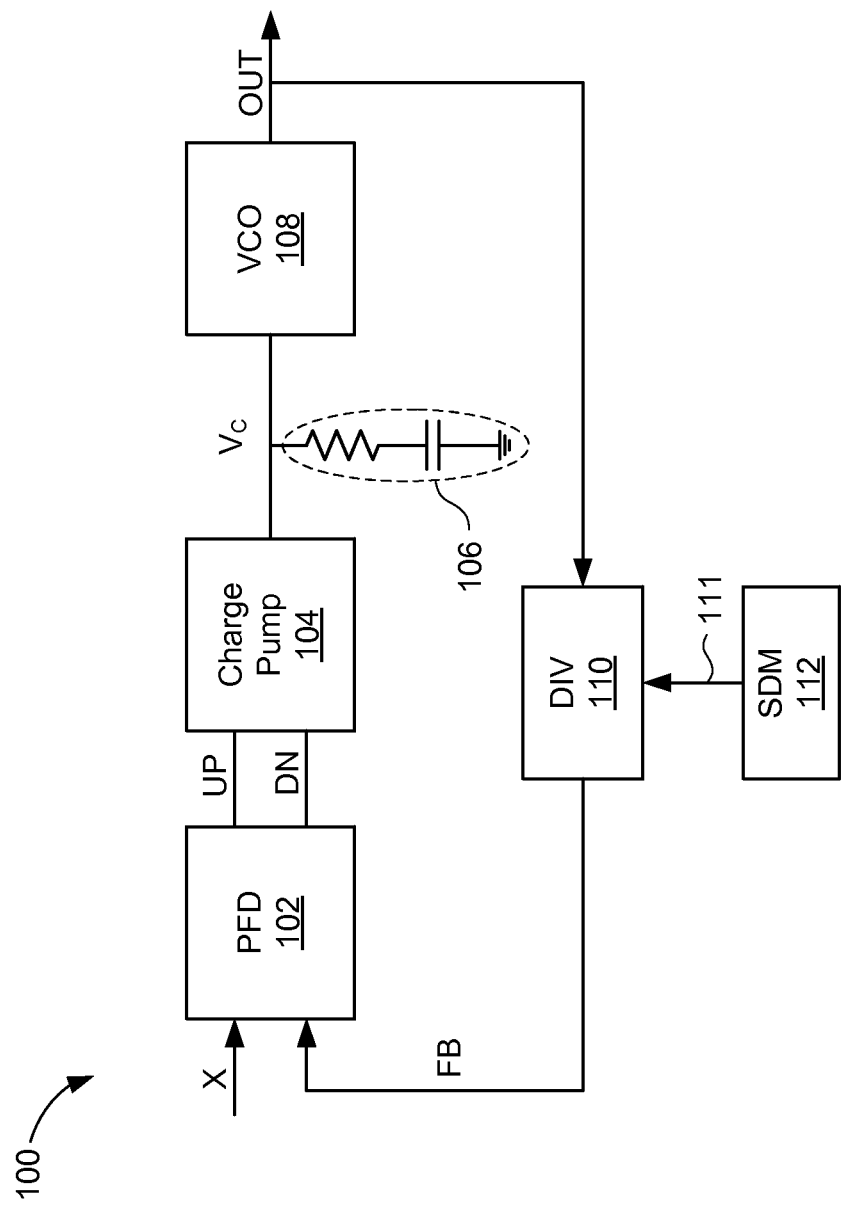
FIG. 1 shows a block diagram of a conventional fractional-N frequency synthesizer.

The frequency doubler 901 includes an input to receive the reference clock signal X, and includes an output to provide a frequency-doubled clock signal ($X_2$). The frequency-doubled clock signal $X_2$ has a frequency that is twice the frequency of the original reference clock signal X. The frequency multiplier 902 includes an input to receive the frequency-doubled clock signal $X_2$, and includes an output to provide a frequency-multiplied clock signal ($X_{2K}$). The frequency-multi- plied clock signal $X_{2K}$ has a frequency that is K times greater than the frequency of the frequency-doubled signal $X_2$, where K is an integer greater than or equal to 2. The fractional-N frequency synthesizer 903 includes an input to receive the frequency-multiplied clock signal $X_{2K}$, and includes an output to provide a high-frequency output clock signal $X_{OUT}$. The output clock signal $X_{OUT}$ generated by the fractional-N frequency synthesizer 903, which for some embodiments may correspond to the fractional-N frequency synthesizer 100 of FIG. 1, may have a frequency that is several times (or more) greater than the frequency of the frequency-multiplied clock signal $X_{2K}$. As described in more detailed below, the system 900 may generate the output clock signal $X_{OUT}$ in response to the original reference clock signal X by successively increasing the frequency of clock signals using cascaded circuits 901-903.

For some embodiments, the frequency doubler 901 may double the frequency of the reference clock signal X to generate the frequency-doubled clock signal $X_2$ by generating a clock positive (or negative) edge from each rising edge and each falling edge of the reference clock signal X. In this manner, the frequency doubler 901 may operate as a double-edge based frequency doubling circuit that generates a rising (or falling) edge in the frequency-multiplied clock signal $X_2$ in response to every state transition of the reference clock signal X. For at least some embodiments, the frequency doubler 901 may include a delay element to generate a delayed clock signal $X_{del}$, and include an XOR logic gate to generate the frequency-doubled clock signal $X_2$ by logically XOR-ing the reference clock signal X and the delayed clock signal $X_{del}$, for example, as described in detail below with respect to FIG. 2.

Figure 10:
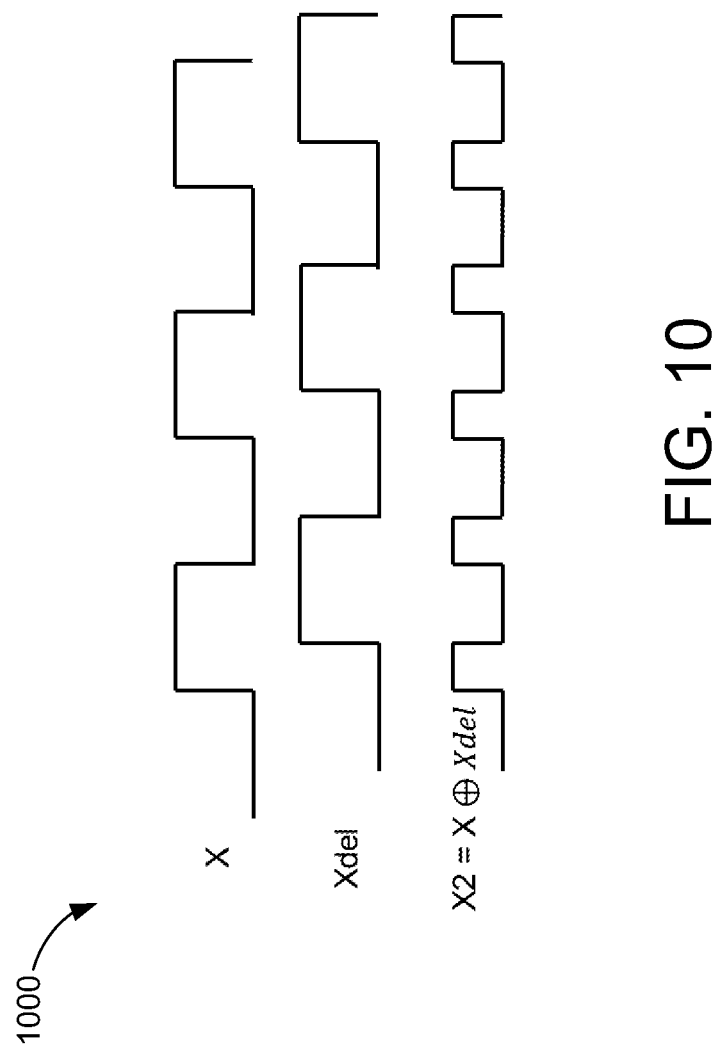
FIG. 10 shows a timing diagram depicting generation of a frequency-doubled clock signal in response to a reference clock signal in accordance with some embodiments.

FIG. 10 is a timing diagram 1000 that depicts generation of the frequency-doubled clock signal $X_2$ in response to a logical XOR combination of the reference clock signal X and the delayed clock signal $X_{del}$, for example, as performed by the circuits described below with respect to FIG. 2.

Referring again to FIG. 9, the frequency multiplier 902 may multiply the frequency of the frequency-doubled clock signal $X_2$ to generate the frequency-multiplied clock signal $X_{2K}$. The frequency multiplier 902 may generate any number (e.g., K) of clock rising (or falling) edges from each rising (or falling) edge of the frequency-doubled clock signal $X_2$, which is triggered by state transitions of the original clock X. In this manner, the frequency multiplier 902 may operate as a single-edge based frequency multiplying circuit that causes K rising (or falling) edges in the frequency-multiplied clock signal $X_{2K}$ in response to each rising (or falling) edge of the frequency-doubled clock signal $X_2$, thereby increasing the frequency of the clock signal $X_2$ by an integer multiple K to generate the clock signal $X_{2K}$. For at least some embodiments, the frequency multiplier 902 may include a delay locked-loop (DLL) circuit and an edge combiner, for example, as depicted in FIG. 11.

Figure 11:
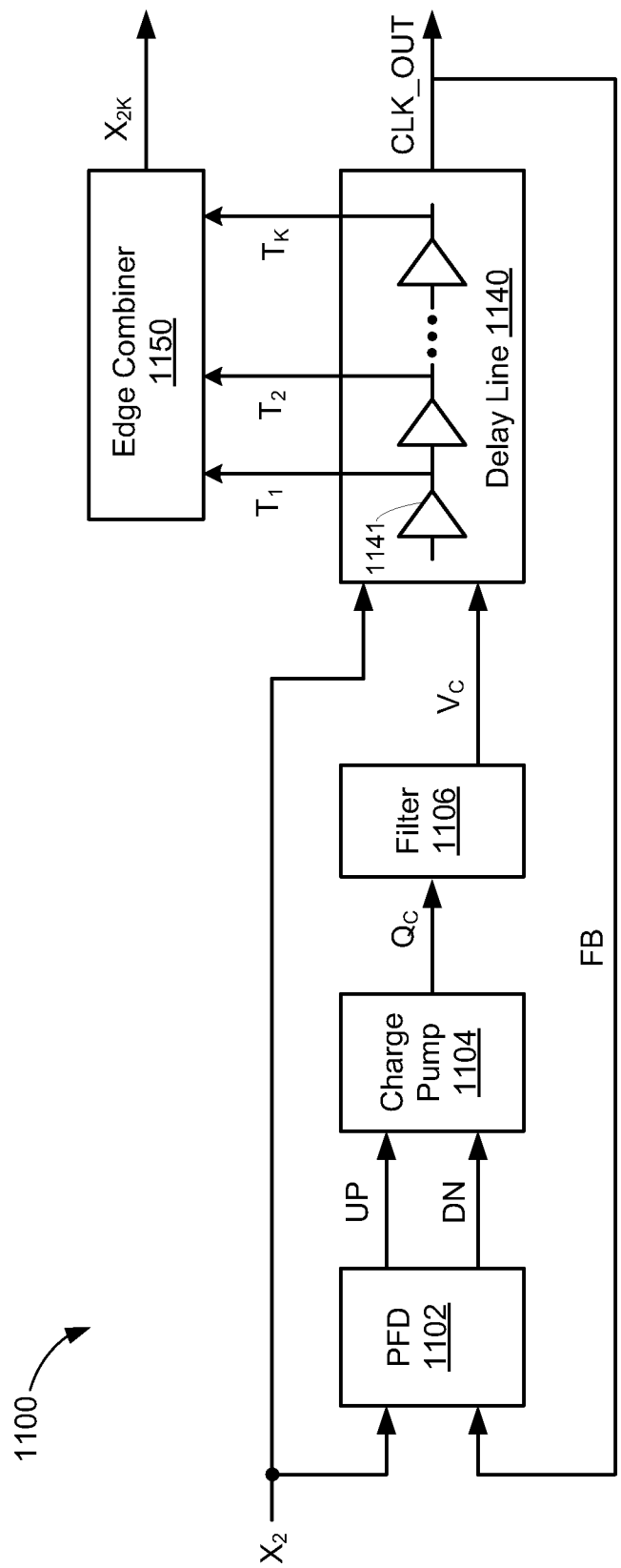
FIG. 11 shows a block diagram of a frequency multiplier circuit in accordance with some embodiments.

FIG. 11 shows a frequency multiplier 1100 that is one embodiment of the frequency multiplier 902 of FIG. 9. The frequency multiplier 1100 includes a DLL circuit formed by a PFD 1102, a charge pump 1104, a loop filter 1106, and a voltage-controlled delay line 1140, and also includes an edge combiner 1150. The PFD 1102 compares the phase of clock signal $X_2$ and a feedback signal FB to generate UP and DN control signals, and charge pump 1104 converts the UP and DN control signals to a charge ($Q_C$) that is proportional to the phase difference between the two signals $X_2$ and FB. The charge generated by the charge pump 1104 is filtered (e.g., integrated) by filter 1106 and provided as a control voltage $V_0$ to delay line 1140. The delay line 1140, which includes a number M of series-connected delay stages 1141 that provide a corresponding number of delay taps $T_1$-$T_K$, selectively delays clock signal $X_2$ in response to $V_C$ to generate an output clock signal CLK_OUT. The output clock signal CLK_OUT, which is provided as the feedback signal FB to PFD 1102, may be synchronized (e.g., delay-locked) with the clock signal $X_2$ by adjusting the signal delay within delay line 1140.

The delay taps $T_1$-$T_K$ provide a plurality of phase delays (e.g., $\Phi_1$, $\Phi_2$, ... $\Phi_K$) of the clock signal $X_2$. The edge combiner 1150 includes a plurality of inputs coupled to corresponding delay taps $T_1$-$T_K$ of the delay line 1140, and includes an output to provide the frequency-multiplied clock signal $X_{2K}$. In operation, the edge combiner 1150 selectively combines edges of the phase delay signals (e.g., $\Phi_1$, $\Phi_2$, ... $\Phi_K$) provided at corresponding delay taps $T_1$-$T_K$ to generate the frequency-multiplied clock signal $X_{2K}$. Accordingly, delay noise may accumulate for no more than K-1 periods of the frequency-multiplied clock signal $X_{2K}$.

Note that the degree (K) of frequency-scaling by the frequency multiplier 1100 may depend upon the total number of delay stages 1141 in the voltage-controlled delay line 1140. For one example, the frequency multiplier 1100 may scale the frequency-doubled clock signal $X_2$ by a multiple of K=2 such that the frequency of clock signal $X_{2K}$ is double the frequency of clock signal $X_2$. For another example, the frequency multiplier 1100 may scale the frequency-doubled clock signal $X_2$ by a multiple of K=4 such that the frequency of clock signal $X_{2K}$ is four times the frequency of clock signal $X_2$.

Figure 12:
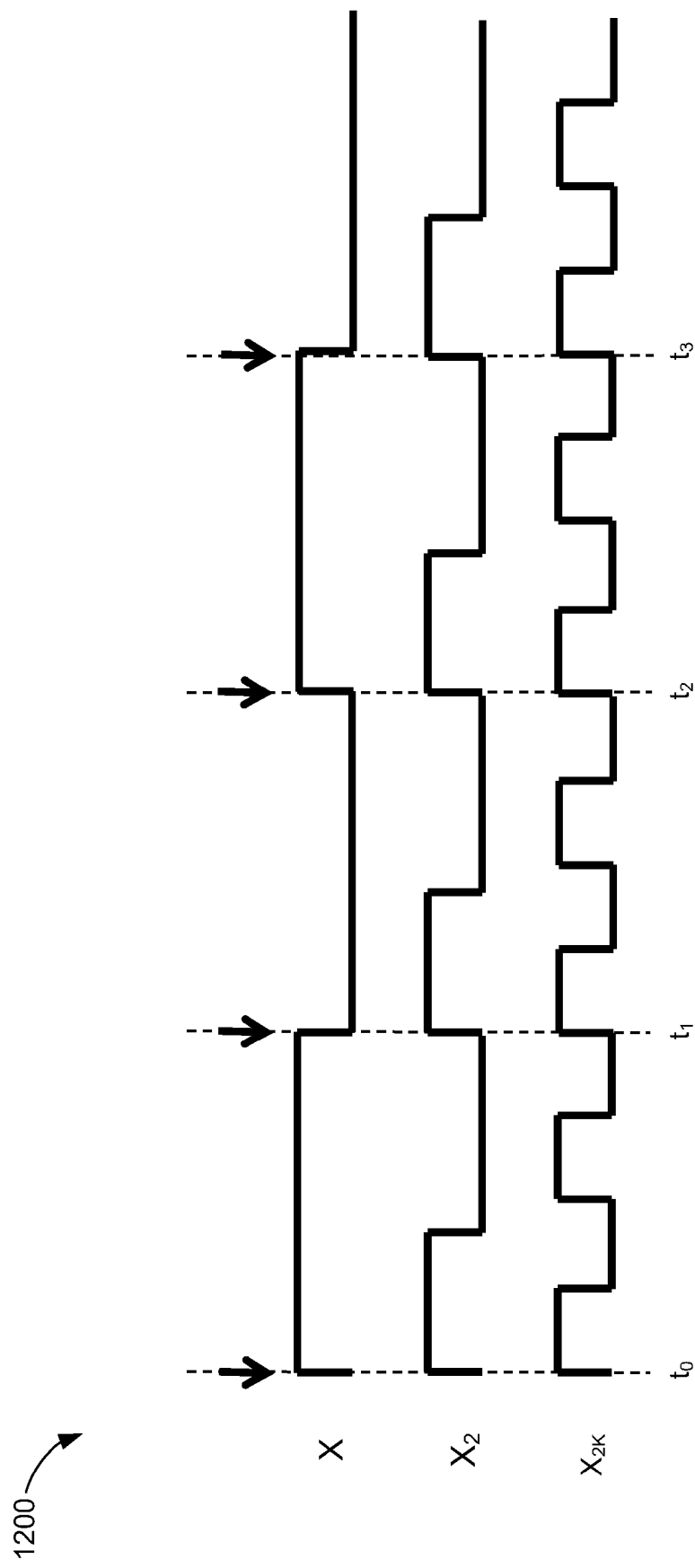
FIG. 12 shows a timing diagram depicting alignment of signals generated within the cascaded frequency synthesizer system of FIG. 9.

FIG. 12 is a timing diagram 1200 that depicts generation of the frequency-doubled clock signal $X_2$ from the reference clock signal X (e.g., by the frequency doubler 901 of FIG. 9), and generation of the frequency-multiplied clock signal $X_{2K}$ from the frequency-doubled clock signal $X_2$ (e.g., by the frequency multiplier 902 of FIG. 9). As depicted in FIG. 12, the first rising edge of the frequency-doubled clock signal $X_2$ is synchronized with the first rising edge of the reference clock signal X at time $t_0$, the second rising edge of $X_2$ is synchronized with the first falling edge of X at time $t_1$, and the third rising edge of $X_2$ is synchronized with the second rising edge of X time $t_2$. Accordingly, the frequency-doubled clock signal $X_2$ may cycle through two periods for every period of the reference clock signal X (e.g., times $t_0$-$t_2$). Because each of the rising (or falling) edges of the frequency-doubled clock signal $X_2$ is synchronized with an edge of the original reference clock signal X, the frequency doubler 901 may double the frequency of the reference clock signal X with minimal phase noise (e.g., as compared to a single-edge based frequency-doubler).

Further, the first rising edge of the frequency-multiplied clock signal $X_{2K}$ is synchronized with the first rising edge of the frequency-doubled clock signal $X_2$ a time $t_0$, the third rising edge of signal $X_{2K}$ is synchronized with the second rising edge of signal $X_2$ at time $t_1$, and the fifth rising edge of signal $X_{2K}$ is synchronized with the third rising edge of signal $X_2$ at time $t_2$. Accordingly, the frequency-multiplied clock signal $X_{2K}$ may cycle through 2K periods for every period of the reference clock signal X (e.g., times $t_0$-$t_2$). Because every $K^{th}$ rising (or falling) edge of the frequency-multiplied clock signal $X_{2K}$ is synchronized with an edge of the frequency-doubled signal $X_2$, the frequency multiplier 902 may increase the frequency of the frequency-doubled signal $X_2$ with minimal phase noise.

Accordingly, by connecting the frequency doubler 901 and the frequency multiplier 902 together in a cascade configuration, the present embodiments may provide a low-noise, high-frequency clock signal $X_{2K}$ that is suitable for use as a reference or input clock signal by the fractional-N frequency synthesizer 903. By increasing the frequency of the clock signal $X_{2K}$ provided to the fractional-N frequency synthesizer 903 (e.g., using the frequency doubler 901 and the frequency multiplier 902), the effects of noise associated with the SDM 112 (see also FIG. 1) may be reduced (e.g., compared with conventional techniques that do not employ frequency doubler 901 and the frequency multiplier 902 as described herein). This may allow increase of the bandwidth of the fractional-N frequency synthesizer 903.

Signal X is typically generated by a crystal oscillator. As mentioned above, the phase noise contribution of the reference clock signal X may be significant because of the low operating voltage of the crystal oscillator generating the reference clock and power dissipation limits of the crystal. Further, there may be a trade-off between the frequency of the crystal oscillator and its phase noise contribution: although higher-frequency crystal oscillators may result in less reference phase noise at the synthesizer output than lower-frequency crystal oscillators, higher-frequency crystals may be more expensive than lower-frequency crystals.

Coupling the double-edge based frequency doubler 901 between the crystal oscillator and the frequency-multiplier 902 may reduce the phase noise associated with the crystal oscillator significantly (e.g., as compared to systems in which the frequency-multiplier 902 is connected directly to the crystal oscillator and the frequency multiplier multiplies the crystal oscillator output by 2K such that the reference frequency to the synthesizer 903 remains the same). For example, if the noise of successive positive and negative edges of the reference clock signal X is uncorrelated, then the phase noise of the frequency-doubled clock signal $X_2$ may be up to 3 dB higher than the phase noise of the reference clock signal X. Because the reference phase noise contribution is reduced by 6 dB when the reference frequency is doubled, the use of the frequency doubler results in an overall reduction in phase noise contribution of the clock X at the synthesizer output of 6 dB–3 dB=3 dB. Furthermore, if successive positive and negative edges of the reference clock X are negatively correlated, using the double edge based doubler the noise introduced by positive edges partially cancels the noise introduced by the negative edges, which may result in reduction of the phase noise contribution of the clock X to the synthesizer output by more than 3 dB.

Thus, by doubling the frequency of the reference clock signal X to generate the frequency-doubled clock signal $X_2$ (using the double-edge based frequency-doubler 901) prior to multiplying the clock frequency using the single-edge based frequency-multiplier 902, phase noise may be reduced. Further, it is noted that use of the frequency-doubler 901 may reduce the noise introduced by the frequency-multiplier 902 because the edges of the frequency-multiplied clock signal $X_{2K}$ may be aligned with edges of the frequency-doubled clock signal $X_2$ (which is twice as often as in systems that do not employ the frequency-doubler 901 between the crystal oscillator and the frequency-multiplier 902).

Because the phase noise of the frequency-multiplied clock signal $X_{2K}$ contributes to the phase noise of the output clock signal $X_{OUT}$ generated by the fractional-N frequency synthesizer 903, reducing the phase noise of the frequency-multiplied clock signal $X_{2K}$ may, in turn, reduce the phase noise of the output clock signal $X_{OUT}$.

Figure 13:
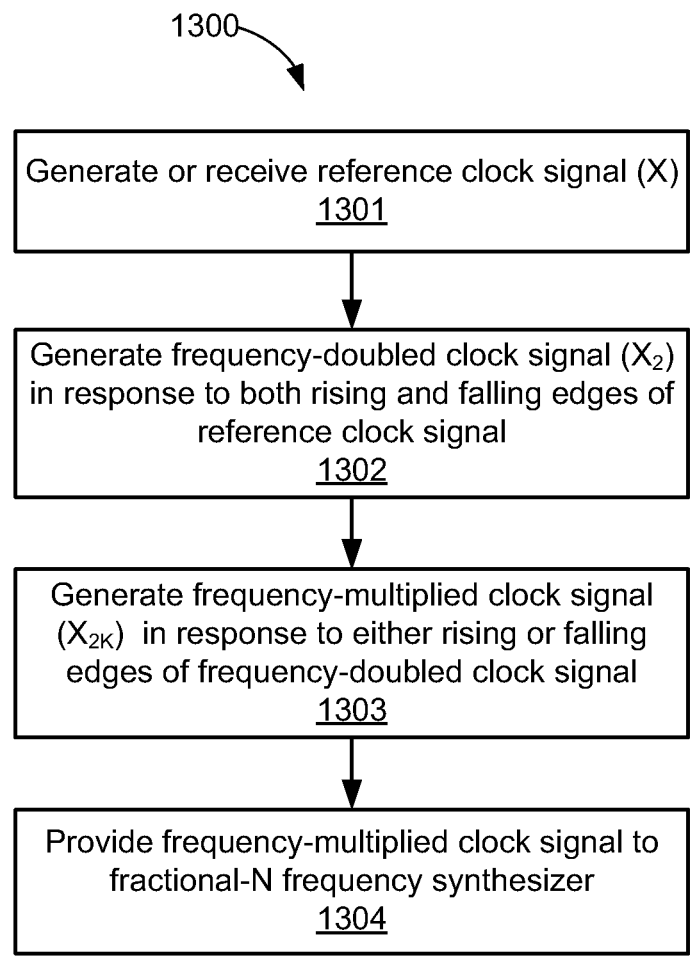
FIG. 13 is an illustrative flow chart depicting an exemplary operation for multiplying the frequency of a clock signal in accordance with some embodiments.

FIG. 13 is an illustrative flow chart 1300 depicting an exemplary frequency multiplying operation performed by the system 900 of FIG. 9. First, the reference clock signal X is either generated or received (by or from a clock generator such as the crystal oscillator of FIG. 9) (1301). Next, the frequency-doubler 901 generates the frequency-doubled clock signal $X_2$ in response to both the rising edges and the falling edges of the reference clock signal X (1302). Then, the frequency-multiplier 902 generates the frequency-multiplied clock signal $X_2K$ in response to either the rising edges or the falling edges of the frequency-doubled clock signal $X_2$ (which in turn are triggered by the edges of the reference clock X) (1303). Finally, the frequency-multiplied clock signal $X_2K$ is provided to the fractional-N frequency synthesizer 903 as reference clock signal or input clock signal (1304).

Figure 2:
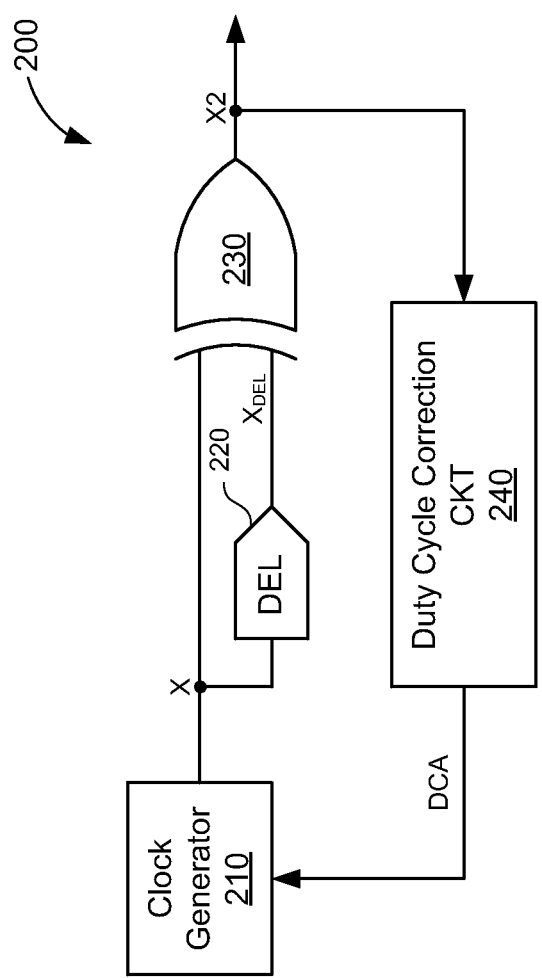
FIG. 2 shows a block diagram of a frequency doubler in accordance with some embodiments.

FIG. 2 shows a block diagram of a clock doubler circuit 200 that is at least one embodiment of the frequency doubler circuit 901 of FIG. 9. The clock doubler circuit 200 doubles the frequency of the clock signal (X) generated by clock generator 210. The doubler includes a delay element 220, a logic gate 230, and a duty cycle correction circuit 240. The clock generator 210, may be any suitable clock generator circuit. The delay element 220 delays the clock signal X to generate a delayed clock signal ($X_{DEL}$). For some embodiments, the delay element 220 may delay the clock signal X by 90 degrees to generate the delayed clock signal $X_{DEL}$. The logic gate 230 logically combines the clock signal X and the delayed clock signal $X_{DEL}$ to generate a frequency-doubled clock signal (X2). For some embodiments, the logic gate 230 may be an XOR gate, as depicted in FIG. 2, such that the frequency of the frequency-doubled clock signal X2 is twice the frequency of the clock signal X.

The duty cycle correction circuit 240 receives the frequency-doubled clock signal X2, and in response thereto generates a duty cycle adjustment (DCA) signal. The clock generator 210 may use the adjustment signal DCA to adjust the duty cycle of the clock signal X. In this manner, the duty cycle correction circuit 240 may create a feedback loop between the logic gate 230 and the clock generator 210 that adjusts (e.g., corrects) the duty cycle of the clock signal X in response to signal characteristics of the frequency-doubled clock signal X2. For some embodiments, the duty cycle correction circuit 240 may generate the adjustment signal in response to time intervals between successive rising edges and/or falling edges of the frequency-doubled clock signal X2, as described in greater detail below.

The adjustment signal DCA may be used to adjust the duty cycle of the clock signal X in a number of ways, for example, depending on the application of the clock doubler 200 and/or the design of the clock generator 210. For at least some embodiments, the adjustment signal DCA may be used to adjust the direct-current (DC) voltage level of an oscillator waveform generated internally by the clock generator 210. For other embodiments, the adjustment signal DCA may be used (e.g., by clock generator 210) to adjust a threshold voltage associated with converting the oscillator waveform into the clock signal X. For other embodiments, the adjustment signal DCA may be used to selectively delay the rising or the falling edges of the clock signal X in order to correct its duty cycle.

By adjusting the duty cycle of the clock signal X in response to the frequency-doubled clock signal X2, the duty cycle correction circuit 240 may be used to correct the duty cycle of the clock signal X to a desired value (e.g., to 50%) that ensures the edges of the frequency-doubled clock signal X2 are uniformly spaced. In this manner, the duty cycle correction circuit 240 may detect oscillations in the period of the frequency-doubled clock signal X2, and then use the detected oscillations to correct the duty cycle of the frequency-doubled clock signal X2. As a result, the clock doubler circuit 200 may produce a high frequency clock signal (e.g., frequency-doubled clock signal X2) with relatively low noise and stable frequency characteristics.

Figure 3:
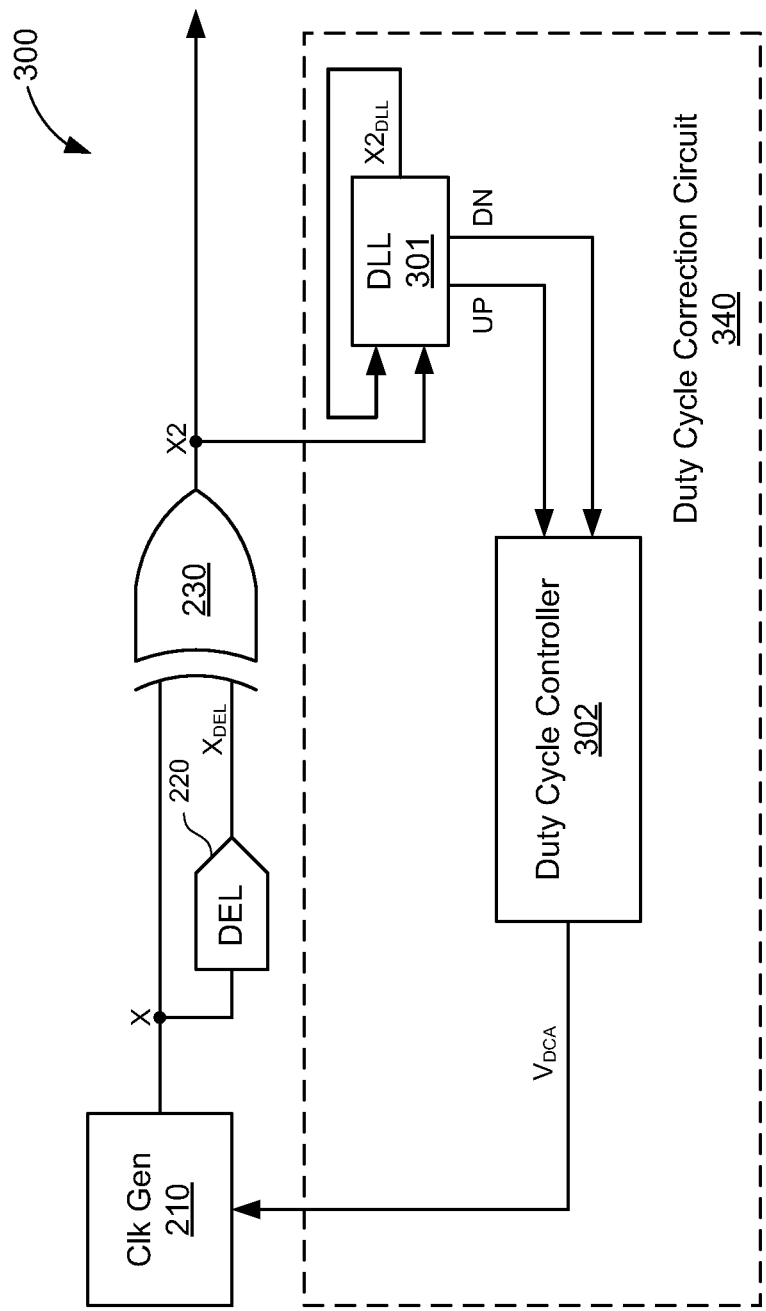
FIG. 3 shows a clock doubler circuit that is one embodiment of the clock doubler circuit of FIG. 2.

FIG. 3 shows a clock doubler circuit 300 that is one embodiment of the clock doubler circuit 200 of FIG. 2. The clock doubler circuit 300 doubles clock signal X generated by clock generator 210. The clock doubler circuit 300 delay element 220, logic gate 230, and duty cycle correction circuit 340. As described above with respect to FIG. 2, the delay element 220 delays the clock signal X (e.g., by 90 degrees) to generate the delayed clock signal $X_{DEL}$, and the logic gate 230 combines signals X and $X_{DEL}$ to generate the frequency-doubled clock signal X2.

Duty cycle correction circuit 340, which may be one embodiment of duty cycle correction circuit 240 of FIG. 2, includes a delay-locked loop (DLL) circuit 301 and a duty cycle controller 302. The DLL circuit 301 includes an input to receive the frequency-doubled clock signal X2, and includes an output to provide a DLL output signal ($X2_{DLL}$). For at least some embodiments, the DLL circuit 301 phase-delays the frequency-doubled clock signal X2 to generate the DLL output signal $X2_{DLL}$. If successive edges of the frequency-doubled clock signal X2 are not uniformly spaced (e.g., because the clock signal X has a duty cycle greater than or less than 50%), then the DLL circuit 301 may generate first control signals (UP and DN) that are indicative of a phase difference between respective (rising or falling) edges of the frequency-doubled clock signal X2 and the DLL output signal $X2_{DLL}$. The duty cycle controller 302 may use the first control signals UP and DN to generate a duty cycle adjustment voltage signal ($V_{DCA}$), which in turn may be used by clock generator 210 to adjust the duty cycle of the clock signal X to a desired value (e.g., to 50%). Thus, for at least some embodiments, the first control signals UP and DN may indicate whether the duty cycle of the clock signal X is to be corrected (and if so, by how much) so that successive edges of the frequency-doubled clock signal X2 are uniformly spaced.

For one or more embodiments, the DLL circuit 301 may be replaced by a suitable phase-locked loop (PLL) circuit. For example, a PLL circuit may generate the first control signals UP and DN in a manner similar to that of the DLL circuit 301.

Figure 4A:
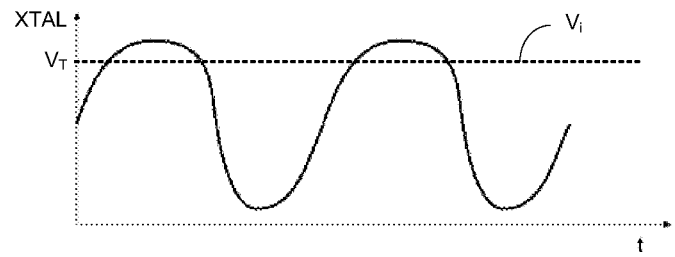
FIGS. 4A-4B depict an exemplary operation for adjusting the duty cycle of a clock signal in accordance with some embodiments.
Figure 4A:
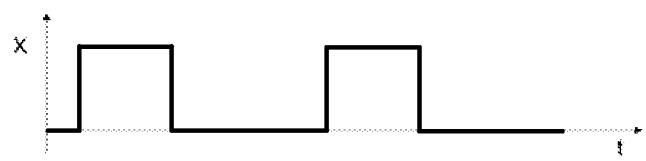
Figure 4B:
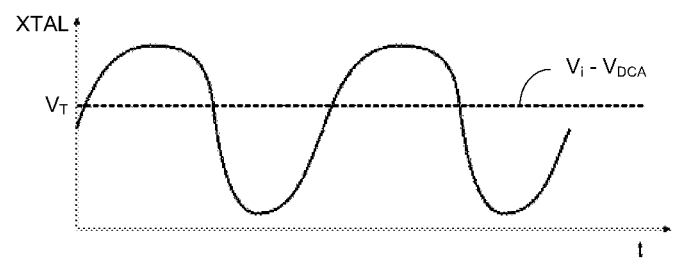
Figure 4B:
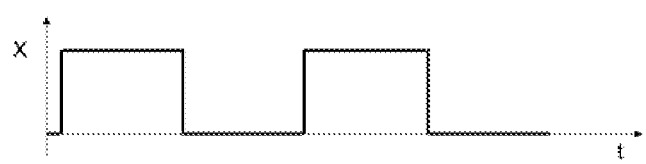

An exemplary operation of clock doubler circuit 300 for adjusting the duty cycle of the reference clock X is described below with respect to FIGS. 4A-4B. For purposes of discussion herein, the clock generator 210 includes a crystal oscillator (not shown for simplicity) that generates a sinusoidal waveform (XTAL), and includes a conversion circuit (not shown for simplicity) that converts the sinusoidal waveform XTAL into a square waveform suitable for output as the clock signal X. In operation, the clock generator 210 may drive the clock signal X to a logic high state when a voltage level of the sinusoidal waveform XTAL rises above a DC threshold voltage ($V_T$), and may drive the clock signal X to a logic low state when the voltage level of the sinusoidal waveform XTAL drops below the threshold voltage $V_T$. In this manner, the rising and falling edges of the clock signal X may be triggered when the sinusoidal waveform XTAL crosses the DC threshold voltage $V_T$.

The DC threshold voltage $V_T$ may be initially set to an initial voltage level $V_i$, and then subsequently adjusted by an amount corresponding to the adjustment signal $V_{DCA}$ so that clock generator 210 may adjust the duty cycle of the clock signal X to a desired value (e.g., to 50%). For some embodiments, if the duty cycle of the clock signal X is less than 50%, then the duty cycle controller 302 may decrease the voltage level (e.g., to a more negative value) of adjustment signal $V_{DCA}$ so that clock generator 210 increases the duty cycle of the clock signal X. Conversely, if the duty cycle of the clock signal X is greater than 50%, then the duty cycle controller 302 may increase the voltage level (e.g., to a more positive value) of adjustment signal $V_{DCA}$ so that clock generator 210 decreases the duty cycle of the clock signal X. For example, FIG. 4A depicts the DC threshold voltage $V_T$ as being initially set to the initial voltage $V_i$, and depicts the resulting clock signal X having a duty cycle that is less than 50%. FIG. 4B depicts the DC threshold voltage $V_T$ as being adjusted to a value equal to $V_i$-$V_{DCA}$, and depicts the resulting clock signal X having an adjusted duty cycle that is substantially equal to 50%.

Figure 5:
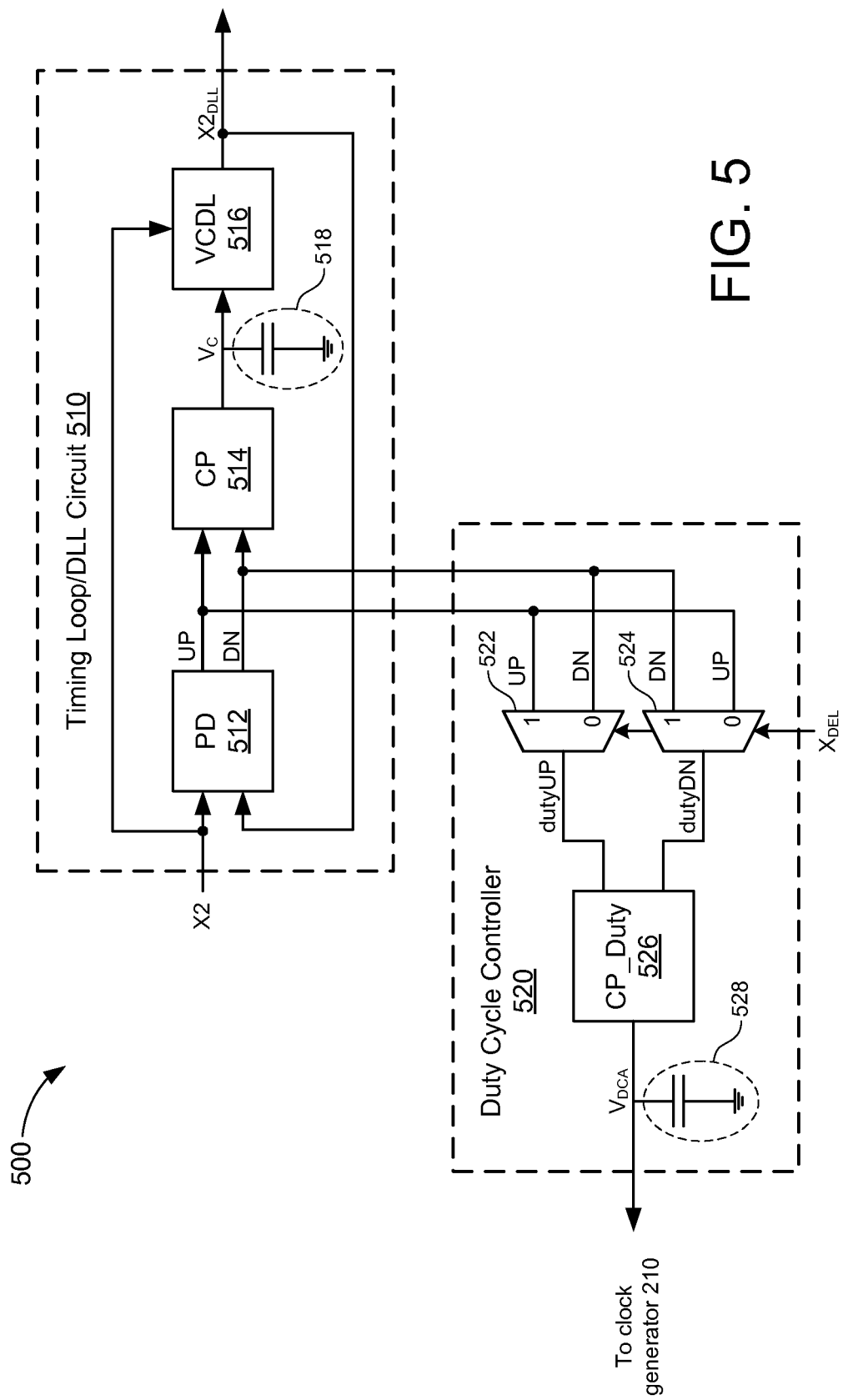
FIG. 5 shows a duty cycle correction circuit in accordance with some embodiments.

FIG. 5 shows a duty cycle correction circuit 500 that is one embodiment of the duty cycle correction circuit 340 of FIG. 3. The duty cycle correction circuit 500 includes a timing loop 510 and a duty cycle controller 520. For the exemplary embodiment of FIG. 5, the timing loop 510 is depicted as a DLL circuit 510; for other embodiments, the timing loop 510 may be a PLL circuit. The DLL circuit 510, which may be one embodiment of DLL circuit 301 of FIG. 3, includes a phase detector (PD) 512, a charge pump (CP) 514, and a voltage-controlled delay line (VCDL). The duty cycle controller 520, which may be one embodiment of duty cycle controller 302 of FIG. 3, includes a first multiplexer 522, a second multiplexer 524, and a duty cycle charge pump (CP_Duty) 526.

In operation, the phase detector 512 compares the relative timing (e.g., the phase difference) between corresponding edges of the frequency-doubled clock signal X2 and the DLL output signal $X2_{DLL}$, and in response thereto generates the first control signals UP and DN. The charge pump 514 generates a control voltage ($V_C$) in response to the first control signals UP and DN, whereby changes in $V_C$ may be proportional to the phase difference between the frequency-doubled clock signal X2 and the DLL output signal $X2_{DLL}$. The control voltage $V_C$, which may result from integration of the charge pump current output on a capacitor 518, may cause the VCDL 516 to align the phase of the DLL output signal $X2_{DLL}$ with the phase of the frequency-doubled clock signal X2. For at least some embodiments, the VCDL 516 may delay the frequency-doubled clock signal X2 using a series of delay stages (not shown for simplicity) controlled by the control voltage $V_C$ to generate the DLL output signal $X2_{DLL}$.

More specifically, when the phase of frequency-doubled clock signal X2 lags the phase of the DLL output signal $X2_{DLL}$ (e.g., when the rising edge of signal X2 occurs after the rising edge of signal $X2_{DLL}$), the phase detector 512 may assert the control signal DN for a longer duration than the control signal UP. Conversely, when the phase of the frequency-doubled signal X2 leads the phase of the DLL output signal $X2_{DLL}$ (e.g., the rising edge of signal X2 occurs before the rising edge of signal $X2_{DLL}$), the phase detector 512 may assert the control signal DN for a shorter duration than the control signal UP.

The first control signals UP and DN are provided to corresponding inputs of multiplexers 522 and 524, each of which includes a control terminal to receive the delayed clock signal $X_{DEL}$. The multiplexers 522 and 524 selectively output the first control signals UP and DN, as selected by the delayed clock signal $X_{DEL}$, to generate second control signals dutyUP and dutyDN, respectively. Note that the first control signals UP and DN are provided to different inputs of respective multiplexers 522 and 524. For example, when the delayed clock signal $X_{DEL}$ is in a logic high state (e.g., logic 1), multiplexer 522 selects control signal UP to be output as control signal dutyUP, and multiplexer 524 selects control signal DN to be output as control signal dutyDN. Conversely, when the delayed clock signal $X_{DEL}$ is in a logic low state (e.g., logic 0), multiplexer 522 selects control signal DN to be output as control signal dutyUP, and multiplexer 524 selects control signal UP to be output as control signal dutyDN. In this manner, for each clock pulse, a control signal dutyUP wider than control signal dutyDN may indicate a duty cycle of signal X less than 50% and a control signal dutyDN wider than control signal duty UP may indicate a duty cycle of signal X greater than 50%. For some embodiments, the first control signals UP and DN may correlate to sets of rising and falling edges of the clock signal X, as described in more detail below with respect to FIG. 6.

The second control signals dutyUP and dutyDN are provided to inputs of the duty cycle charge pump 526. The charge pump 526 generates the adjustment signal $V_{DCA}$ in response to the second control signals dutyUP and dutyDN, whereby changes in the adjustment signal $V_{DCA}$ may be proportional to a difference between the duty cycle of the clock signal X and a desired duty cycle (e.g., 50%). In response to the adjustment signal $V_{DCA}$, the clock generator 210 (see also FIGS. 2 and 3) may adjust the duty cycle of the clock signal X (e.g., to the desired duty cycle). For example, asserting control signal dutyUP for a longer duration than asserting control signal dutyDN may cause the charge pump 526 to decrease the voltage level of the adjustment signal $V_{DCA}$, which in turn may cause the clock generator 210 to increase the duty cycle of the clock signal X. Conversely, asserting control signal dutyDN for a longer duration than asserting control signal dutyUP may cause the charge pump 526 to increase the voltage level of the adjustment signal $V_{DCA}$, which in turn may cause the clock generator 210 to decrease the duty cycle of the clock signal X. For some embodiments, the adjustment signal $V_{DCA}$ may result from integration of the current output of the charge pump 526 on a capacitor 528.

As mentioned above, for other embodiments, the timing loop 510 may be a PLL circuit (rather than a DLL circuit). For such other embodiments, the voltage-controlled delay line 516 may be replaced with a voltage-controlled oscillator that is to adjust a frequency of the timing loop output signal $X2_{DLL}$ in response to the control voltage $V_C$.

Figure 6:
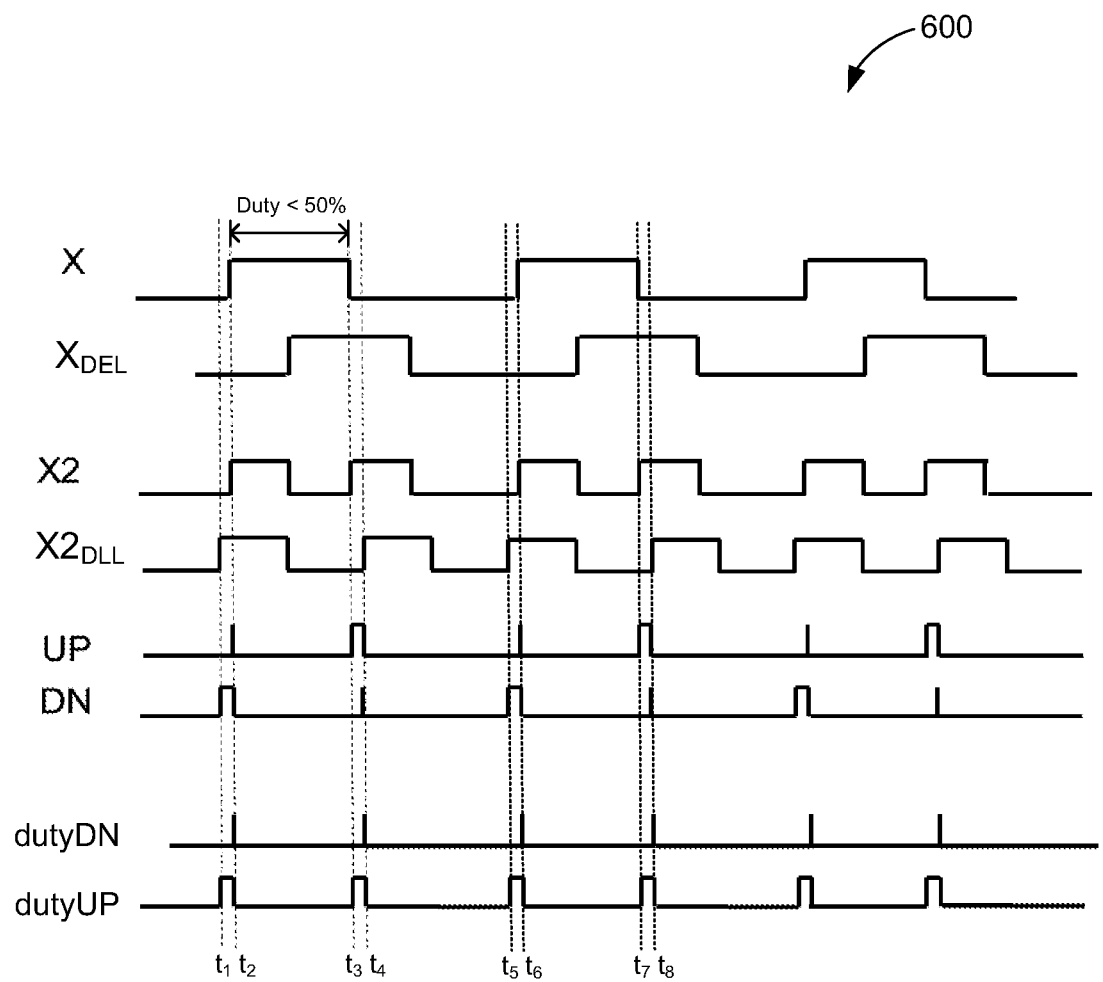
FIG. 6 depicts an exemplary timing diagram of a clock doubling operation in accordance with some embodiments.

FIG. 6 shows an illustrative timing diagram 600 for an exemplary operation of the duty cycle correction circuit 500 of FIG. 5. Referring also to FIG. 5, the first rising edge of the frequency-doubled clock signal X2 (at time $t_2$) may correspond with (e.g., may be triggered by) the first rising edge of the clock signal X, and the second rising edge of the frequency-doubled clock signal X2 (at time $t_3$) may correspond with (e.g., may be triggered by) the first falling edge of the clock signal X. Then, because the phase of the frequency-doubled clock signal X2 lags the phase of the DLL output signal $X2_{DLL}$ (between times $t_1$ and $t_2$), the phase detector 512 asserts the control signal DN for a longer duration (between times $t_1$ and $t_2$) than it asserts the control signal UP (a narrow pulse at time $t_2$). Note the first control signals UP and DN, which may indicate the phase difference between the frequency-doubled clock signal X2 and the DLL output signal $X2_{DLL}$, are both in an asserted state at time $t_2$ which may correspond to the first rising edge of the clock signal X). In response to the logic low state of signal $X_{DEL}$, multiplexer 522 passes the control signal DN to as signal dutyUP charge pump 526, and multiplexer 524 passes the control signal UP as signal dutyDN to charge pump 526. Because the asserted pulse width of control signal dutyUP is longer than the asserted pulse width of control signal dutyDN between times $t_1$ and $t_2$, as depicted in FIG. 6, charge pump 526 decreases the voltage level of the adjustment signal $V_{DCA}$, which in turn may cause the clock generator 210 to increase the duty cycle of the clock signal X.

Thereafter, because the phase of the frequency-doubled clock signal X2 leads the phase of the DLL output signal $X2_{DLL}$ between times $t_3$ and $t_4$, the phase detector 512 asserts the control signal UP for a longer duration (between times $t_3$ and $t_4$) than it asserts the control signal DN (a narrow pulse at time $t_4$). In response to the logic high state of signal $X_{DEL}$, multiplexer 522 passes the control signal UP to as signal dutyUP charge pump 526, and multiplexer 524 passes the control signal DN as signal dutyDN to charge pump 526. Because the asserted pulse width of control signal dutyUP is longer than the asserted pulse width of control signal dutyDN between times $t_3$ and $t_4$, as depicted in FIG. 6, charge pump 526 decreases the voltage level of the adjustment signal $V_{DCA}$, which in turn may cause the clock generator 210 to increase the duty cycle of the clock signal X.

Note that adjustment signal $V_{DCA}$ may be used to adjust the duty cycle (e.g., correct the duty cycle error) of the clock signal X by analog and/or digital circuitry or technique. For example, the adjustment signal $V_{DCA}$ may be used as a digital indicator of whether the duty cycle of the clock signal X is to be increased, decreased, or not adjusted. The duty cycle of the clock signal X may then be corrected in discrete steps by digital means. On the other hand, if the adjustment signal $V_{DCA}$ is used in an analog loop, a low pass filter may be used to eliminate noise.

Figure 7:
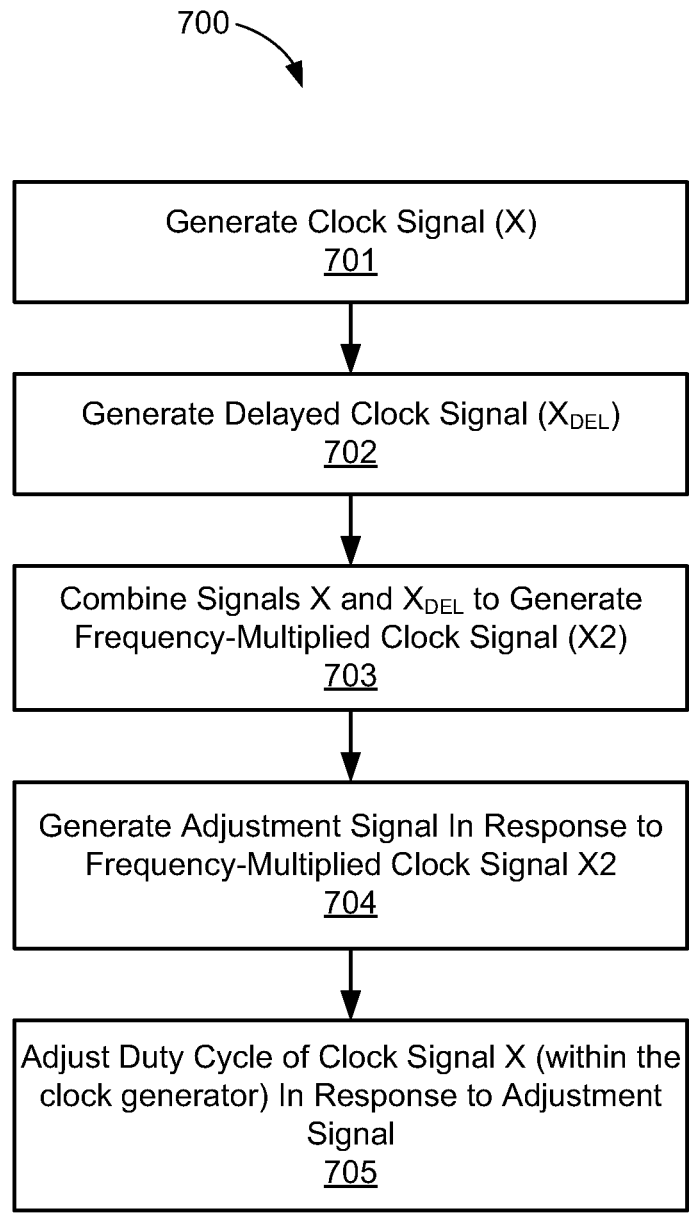
FIG. 7 is an illustrative flow chart depicting an exemplary clock doubling operation in accordance with some embodiments and FIG. 8 is an illustrative flow chart depicting an exemplary operation for adjusting the duty cycle of a clock signal in accordance with some embodiments.

FIG. 7 is an illustrative flow chart depicting an example operation 700 in accordance with some embodiments. As described above, the present embodiments may generate a stable frequency-multiplied clock signal using feedback to control the duty cycle of the original clock signal X. Referring also to FIGS. 2, 3, and 5, the clock signal X is generated by clock generator 210 (701), and then the clock signal X is delayed by delay element 220 to generate the delayed clock signal $X_{DEL}$ (702). For some embodiments, the clock signal X may have relatively low noise and stable frequency characteristics. For some embodiments, the delayed clock signal $X_{DEL}$ may have a 90-degree phase offset relative to the clock signal X.

The clock signal X and the delayed clock signal $X_{DEL}$ are then combined to generate the frequency-doubled clock signal X2 (703). For example, the clock signal X and the delayed clock signal $X_{DEL}$ may be exclusive -ORed by logic gate 230 to generate the frequency-doubled clock signal X2 (e.g., such that the frequency of the frequency-doubled clock signal X2 is double the frequency of the original clock signal X).

Next, an adjustment signal DCA is generated in response to the frequency-doubled clock signal X2 (704), and then the duty cycle of the clock signal X is adjusted to a desired value in response to the adjustment signal DCA (705). For example, the duty cycle correction circuit 240 may receive the clock signal X2 and generate the adjustment signal DCA in response to signal characteristics of the frequency-doubled clock signal X2. For some embodiments, the adjustment signal DCA may be used to adjust the DC threshold voltage level of the oscillator waveform created by the clock generator 210, as described with reference to FIGS. 4A-4B. For other embodiments, the adjustment signal DCA may be used to selectively delay the rising or the falling edges of the clock signal X.

By using the frequency-doubled clock signal X2 to adjust the duty cycle of the clock signal X, the operation 700 may correct the duty cycle of the clock signal X (e.g., to 50%), thereby stabilizing the waveform of the frequency-doubled clock signal X2 (e.g., so that the edges of the frequency-doubled clock signal X2 are uniformly spaced). Accordingly, the clock multiplication operation 700 may be used to generate a high frequency clock signal with relatively low noise and stable frequency characteristics.

Figure 8:
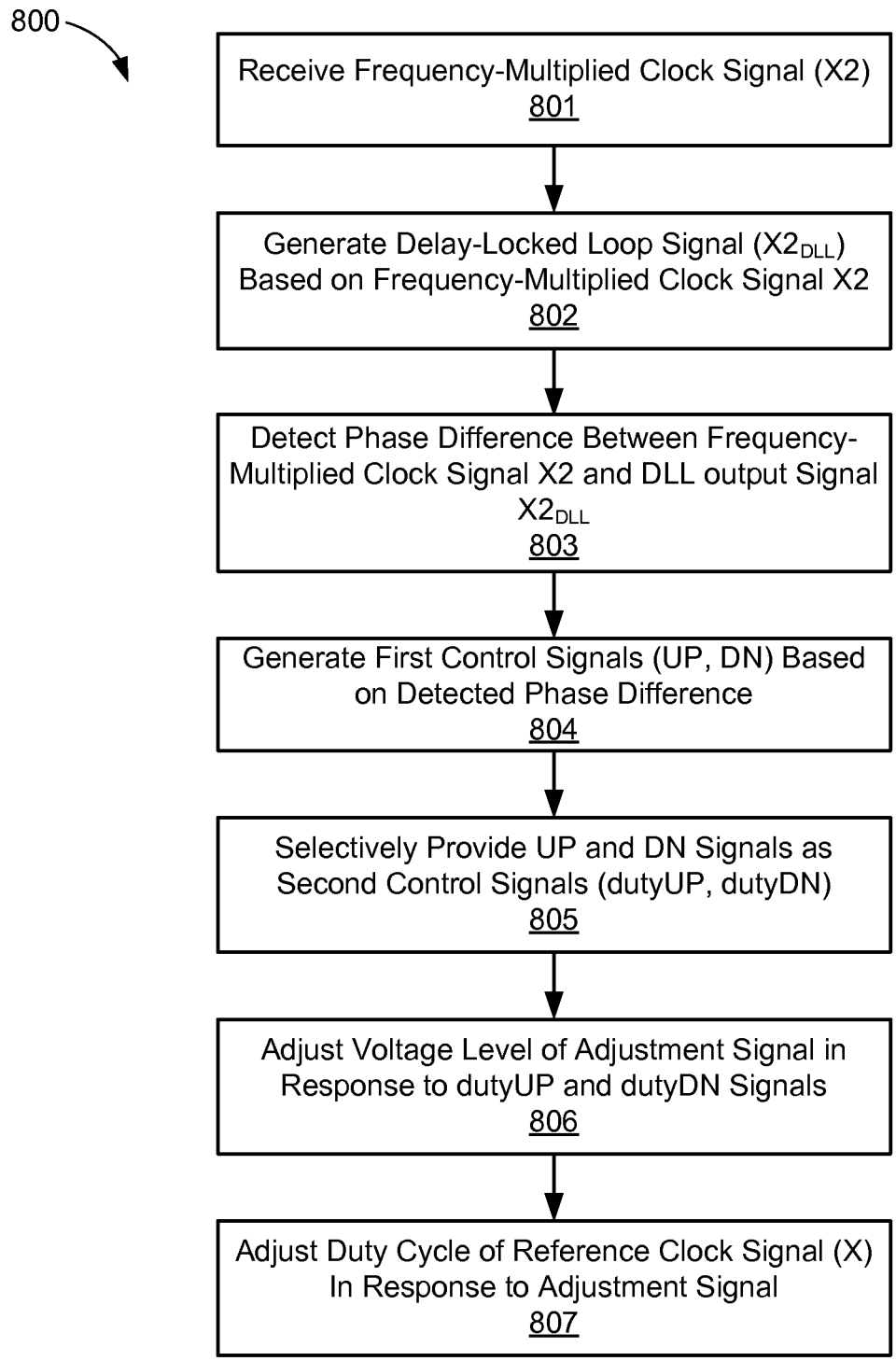

FIG. 8 is an illustrative flow chart depicting an example operation 800 of duty cycle correction circuit 500 of FIG. 5 in accordance with some embodiments. First, DLL circuit 510 receives the frequency-doubled clock signal X2 (801), and then delays the frequency-doubled clock signal X2 to generate the DLL output signal $X2_{DLL}$ (802). Next, the phase detector 512 detects the phase difference between the frequency-doubled clock signal X2 and the DLL output signal $X2_{DLL}$ (803), and in response thereto generates the first control signals UP and DN (as well as the control voltage $V_C$) (804). For example, the phase detector 512 may generate the first control signals UP and DN while charge pump 514 and voltage-controlled delay line 516 are to phase-align the DLL output signal $X2_{DLL}$ with the frequency-doubled clock signal X2. As described above, the first control signals UP and DN may indicate the phase difference between respective edges of the frequency-doubled clock signal X2 and the DLL output signal $X2_{DLL}$ (e.g., as shown in FIG. 6).

Next, the first control signals UP and DN are selectively provided as the second control signals dutyUP and dutyDN by multiplexers 522 and 524, respectively (805). For example, when the delayed clock signal $X_{DEL}$ is in a logic low state, multiplexer 522 provides the control signal DN as control signal dutyUP to charge pump 526, and multiplexer 524 provides the control signal UP as control signal dutyDN to charge pump 526. Conversely, when the delayed clock signal $X_{DEL}$ is in a logic high state, multiplexer 522 provides the control signal UP as control signal dutyUP to charge pump 526, and multiplexer 524 provides the control signal DN as control signal dutyDN to charge pump 526. For some embodiments, assertion of the control signal dutyUP (e.g., for a longer duration than assertion of the control signal dutyDN) may indicate that the duty cycle of the clock signal X is greater than 50%, and assertion of the control signal dutyDN (e.g., for a longer duration than assertion of the control signal dutyUP) may indicate that the duty cycle is less than 50%.

The second control signals dutyUP and dutyDN may be used to adjust the voltage level of the adjustment signal DCA (806). For example, the charge pump 526 may increase, decrease, or maintain the voltage level of the adjustment signal $V_{DCA}$ in response to the second control signals dutyUP and dutyDN, whereby changes in the voltage level of $V_{DCA}$ may be proportional to the difference between the duty cycle of the clock signal X and the desired duty cycle (e.g., 50%) of the clock signal X. For some embodiments, charge pump 526 may decrease the voltage of adjustment signal $V_{DCA}$ when control signal dutyUP is asserted for a longer duration than control signal dutyDN, and charge pump 526 may increase the voltage of adjustment signal $V_{DCA}$ when control signal dutyDN is asserted for a longer duration than control signal dutyUP.

Finally, the adjustment signal DCA may be used to adjust the duty cycle of the clock signal X (807). For some embodiments, the duty cycle of the clock signal X may be decreased or increased by respectively raising or lowering the clock generator 210's DC voltage or the threshold voltage ($V_T$) of a first buffer (gate) associated with converting the sinusoidal waveform XTAL into a square waveform suitable for output as the clock signal X by an amount indicated by the voltage level of the adjustment signal DCA (e.g., as described above with respect to FIGS. 4A-4B). For other embodiments, the adjustment signal DCA may be used as a digital indicator of whether the duty cycle of the clock signal X is greater than 50% or less than 50%.

It will be appreciated that embodiments described herein may be used to produce a high frequency clock signal with relatively low noise and stable frequency characteristics. Specifically, the use of a feedback loop allows the duty cycle of a clock signal to be corrected in response to timing errors directly detected in the frequency-multiplied output clock signal. The frequency-multiplied clock signal produced in this manner may be used for a variety of applications, including but not limited to, an input clock signal to a frequency synthesizer (e.g., a fractional-N frequency synthesizer).

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, the method steps depicted in the flow charts of FIGS. 7-8 may be performed in other suitable orders and/or multiple steps may be combined into a single step.

What is claimed is:

1. A frequency synthesizing system, comprising:
a clock generator to generate a reference clock signal;
a frequency doubler, including an input to receive the reference clock signal, to generate a frequency-doubled clock signal in response to rising edges and falling edges of the reference clock signal, wherein the frequency doubler comprises:
   a delay element to generate a delayed clock signal in response to the reference clock signal;
   an exclusive-OR (XOR) logic gate to generate the frequency-doubled clock signal in response to a combination of the reference clock signal and the delayed clock signal; and
   a duty cycle correction circuit, coupled between the logic gate and a control terminal of the clock generator, to generate an adjustment signal based at least in part on the frequency-doubled clock signal, wherein the clock generator is to adjust a duty cycle of the reference clock signal in response to the adjustment signal;
a frequency multiplier, coupled to the frequency doubler, to generate a frequency-multiplied clock signal in response to either rising edges or falling edges of the frequency-doubled clock signal; and
a fractional-N synthesizer, coupled to the frequency multiplier, to generate an output clock signal in response to the frequency-multiplied clock signal.

2. The system of claim 1, where the frequency doubler, the frequency multiplier, and the fractional-N synthesizer are coupled together in a cascade configuration.

3. The system of claim 1, wherein:
the frequency doubler is to operate as a double-edge based frequency doubling circuit; and
the frequency multiplier is to operate as a single-edge based frequency doubling circuit.

4. The system of claim 1, wherein the clock generator is a crystal oscillator.

5. The system of claim 1, wherein the frequency-multiplied clock signal has a frequency that is a number K times a frequency of the frequency-doubled clock signal, wherein the K is an integer greater than or equal to 2.

6. The system of claim 1, wherein the output clock signal has a frequency that is an integer multiple of a frequency of the frequency-multiplied clock signal.

7. The system of claim 1, wherein the duty cycle correction circuit comprises:
a timing loop to generate an output signal in response to the frequency-doubled clock signal; and
a duty cycle controller to generate the adjustment signal in response to a first control signal indicative of a phase difference between the timing loop output signal and the frequency-doubled clock signal.

8. The system of claim 7, further comprising a phase detector to:
compare the phase difference between the timing loop output signal and the frequency-doubled clock signal, and
generate the first control signal and a second control signal indicative of the phase difference as compared by the phase detector,
wherein the duty cycle controller is to generate the adjustment signal further in response to the second control signal.

9. The system of claim 1, wherein the frequency multiplier comprises:
a delay-locked loop (DLL) circuit comprising a voltage-controlled delay line including a plurality of delay taps to delay the frequency-doubled clock signal; and
an edge combiner, coupled to the voltage-controlled delay line, to combine an output of each of one or more delay stages of the voltage-controlled delay line to produce the frequency-multiplied clock signal.

10. A method for multiplying a frequency of a clock signal, the method comprising:
generating a reference clock signal using a clock generator;
generating a frequency-doubled clock signal, using a frequency doubler, in response to both rising edges and falling edges of the reference clock signal, wherein the frequency-doubled clock signal is generated by:
   generating a delayed clock signal in response to the reference clock signal;
   logically combining the reference clock signal and the delayed clock signal to generate the frequency-doubled clock signal;
   generating an adjustment signal in response to the frequency-doubled clock signal; and
   adjusting a duty cycle of the reference clock signal, using the clock generator, in response to the adjustment signal;
generating a frequency-multiplied clock signal, using a frequency-multiplier, in response to either rising edges or falling edges of the frequency-doubled clock signal; and
generating an output clock signal, using a fractional-N frequency synthesizer, in response to the frequency-multiplied clock signal.

11. The method of claim 10, wherein:
the frequency doubler is to operate as a double-edge based frequency doubling circuit; and
the frequency multiplier is to operate as a single-edge based frequency doubling circuit.

12. The method of claim 10, wherein generating the adjustment signal comprises:
comparing a phase difference between a timing loop output signal and the frequency-doubled clock signal, and
generating a first control signal and a second control signal indicative of the phase difference.

13. The method of claim 10, wherein generating the frequency-multiplied clock signal comprises:
generating a plurality of phase-delayed signals in response to the frequency-doubled clock signal; and
selectively combining the plurality of phase-delayed signals, using an edge combiner, to generate the frequency-multiplied clock signal.

14. A system for multiplying a frequency of a clock signal, the system comprising:
means for generating a reference clock signal;

means for generating a frequency-doubled clock signal in response to both rising edges and falling edges of the reference clock signal by:
  generating a delayed clock signal in response to the reference clock signal;
  logically combining the reference clock signal and the delayed clock signal to generate the frequency-doubled clock signal;
  generating an adjustment signal in response to the frequency-doubled clock signal; and
  adjusting a duty cycle of the reference clock signal, using the clock generator, in response to the adjustment signal;
means for generating a frequency-multiplied clock signal in response to either rising edges or falling edges of the frequency-doubled clock signal; and
means for generating an output clock signal in response to the frequency-multiplied clock signal.

15. The system of claim 14, wherein the means for generating the adjustment signal is to:
  compare a phase difference between a timing loop output signal and the frequency-doubled clock signal, and
  generate a first control signal and a second control signal indicative of the phase difference.

16. The system of claim 14, wherein the means for generating the frequency-multiplied clock signal comprises:
  means for generating a plurality of phase-delayed signals in response to the frequency-doubled clock signal; and
  means for selectively combining the plurality of phase-delayed signals, using an edge combiner, to generate the frequency-multiplied clock signal.

* * * * *